(12) United States Patent
Chang et al.

(10) Patent No.: US 9,000,511 B2
(45) Date of Patent: Apr. 7, 2015

(54) NON-VOLATILE MEMORY DEVICE

(75) Inventors: Sung-Il Chang, Hwaseong-si (KR);
Young-Woo Park, Seoul (KR)

(73) Assignee: Samsung Electronics Co., Ltd.,
Suwon-si, Gyeonggi-do (KR)

(*) Notice: Subject to any disclaimer, the term of this patent is extended or adjusted under 35 U.S.C. 154(b) by 190 days.

(21) Appl. No.: 13/529,621

(22) Filed: Jun. 21, 2012

(65) Prior Publication Data
US 2012/0326225 A1   Dec. 27, 2012

(30) Foreign Application Priority Data
Jun. 21, 2011 (KR) .................. 10-2011-0060117

(51) Int. Cl.
*H01L 29/792* (2006.01)
*H01L 27/115* (2006.01)

(52) U.S. Cl.
CPC ........ *H01L 29/792* (2013.01); *H01L 27/11568* (2013.01)

(58) Field of Classification Search
CPC .................. H01L 29/792; H01L 27/11568
USPC .................................................. 257/326
See application file for complete search history.

(56) References Cited

U.S. PATENT DOCUMENTS

| 2010/0019311 A1 | 1/2010 | Sato et al. | |
|---|---|---|---|
| 2010/0230741 A1* | 9/2010 | Choi et al. | 257/324 |
| 2011/0163367 A1* | 7/2011 | Kang et al. | 257/316 |
| 2012/0049245 A1* | 3/2012 | Bicksler et al. | 257/202 |
| 2012/0049266 A1* | 3/2012 | Oh et al. | 257/316 |

FOREIGN PATENT DOCUMENTS

| JP | 2009-267208 | 11/2009 |
|---|---|---|
| JP | 2010-027922 | 2/2010 |
| KR | 10-2006-0130297 | 12/2006 |
| KR | 10-2009-0095392 | 9/2009 |

OTHER PUBLICATIONS

English Abstract for Publication No. 10-2006-0130297.
English Abstract for Publication No. 10-2009-0095392.
English Abstract for Publication No. 2009-267208.
English Abstract for Publication No. 2010-027922.

* cited by examiner

*Primary Examiner* — Kimberly Rizallah
*Assistant Examiner* — Mounir Amer
(74) *Attorney, Agent, or Firm* — F. Chau & Associates, LLC

(57) ABSTRACT

A non-volatile memory device includes a substrate having an active region defined by a device isolation region that has a trench and an air gap, a device isolation pattern positioned at a lower portion of the trench, a memory cell layer including a tunnel insulation layer, a trap insulation layer and a blocking insulation layer that are sequentially stacked on the active region and one of which extends from the active region toward the device isolation region encloses top of the air gap whose bottom is defined by a layer other than that of the top, and a control gate electrode positioned on the cell structure. The one of the insulation layer extending includes a recess at a region corresponding to the center of the air gap.

15 Claims, 12 Drawing Sheets

NON-VOLATILE MEMORY DEVICE

CROSS-REFERENCE TO RELATED APPLICATIONS

This application claims the benefit of Korean Patent Application No. 10-2011-0060117 filed on Jun. 21, 2011 in the Korean Intellectual Property Office, the disclosure of which is incorporated by reference herein in its entirety.

TECHNICAL FIELD

The present inventive concept relates to a non-volatile memory device and a method of manufacturing thereof, and more particularly, to an air gap isolation structure to minimize cell-to-cell interference and method of manufacturing the gap isolation structure in the non-volatile memory device.

DESCRIPTION OF THE RELATED ART

With integration density increasing, cell-to-cell distance decreases, a charge trap non-volatile memory suffers from memory cell errors arising from cell-to-cell interference. For example, when some data are programmed in a memory cell of the charge trap non-volatile memory device, an adjacent memory cell neighboring the memory cell is also programmed into the same data by the interference between neighboring memory cells. Accordingly, a charge trap non-volatile memory is desired to have a device isolation structure to suppress the cell-to-cell interference.

SUMMARY

Exemplary embodiments of the present inventive concept provide a non-volatile memory device in which cell-to-cell interference is minimized.

In an embodiment of the inventive concept, a non-volatile memory device comprises a substrate having an active region defined by a device isolation region that has a trench and an air gap, a device isolation pattern positioned at a lower portion of the trench, a memory cell layer including a tunnel insulation layer, a trap insulation layer and a blocking insulation layer that are sequentially stacked on the active region and one of which extends from the active region toward the device isolation region encloses top of the air gap whose bottom is defined by a layer other than that of the top, and a control gate electrode positioned on the cell structure. The one of the insulation layer extending includes a recess at a region corresponding to the center of the air gap.

In a further embodiment, the tunnel insulation layer is conformally formed on the active region and the trench. The trap insulation layer is positioned on the tunnel insulation layer formed on active region and is not connected to other insulation layers adjacent to the trap insulation layer. The one of the insulation layer extending is the blocking insulation layer positioned on the trap insulation layer. The top of the air gap is defined by the trap insulation layer and the blocking insulation layer.

Alternatively, the trap insulation layer is positioned on tunnel insulation layer formed on the active region, and the one of the insulation layer extending is the trap insulation layer. The top of the air gap is defined by the trap insulation layer and the bottom is defined by a portion of the tunnel insulation layer that is formed on the device isolation pattern.

Alternatively, the tunnel insulation layer is positioned on the active region, and the one of the insulation layer extending is the tunnel insulation layer. The top of the air gap is defined by the trap insulation layer and the bottom is defined by a top surface of the device isolation pattern.

Lastly, the tunnel insulation layer is positioned on the active region and is not connected to other tunnel insulation layers adjacent to the tunnel insulation layer. The one of the insulation layer extending is the trap insulation layer positioned on the tunnel insulation layer. The top of the air gap is defined by the tunnel insulation layer and the trap insulation layer and the bottom is defined by a top surface of the device isolation pattern.

In another further embodiment, the one of the insulation layer extending includes a recess at a region corresponding to the center of the air gap. Width of the trench decreases with increasing depth and a corner angle between an upper surface of the active region and a sidewall of the trench is over 90°. The trap insulation layer includes any one material selected from the group consisting of silicon nitride, silicon oxynitride, aluminum oxide, hafnium oxide and compositions thereof. The tunnel insulation layer includes one of a silicon oxide layer and a silicon oxynitride layer.

In an another embodiment of the inventive concept, a method of manufacturing a non-volatile memory device comprise a step forming a trench on a substrate and an active region defined by the trench, a step of forming a device isolation pattern positioned at a lower portion of the trench, a step of forming a memory cell layer including a tunnel insulation layer, a trap insulation layer and a blocking dielectric layer that are sequentially stacked on the active region, a step of forming one of the insulation layers extending from the active region toward the device isolation region to enclose top of an air gap, bottom of the air gap being defined by a layer other than that of the top, and a step of forming a control gate electrode positioned on the cell structure.

In a further embodiment, the step of forming one of the insulation layers extending is carried out with the substrate tilted at a first tilt angle, and then at a second tilt angle.

In a still another embodiment of the inventive concept, a non-volatile memory device comprises a substrate, a first active region in the substrate, a second active region in the substrate, a memory cell layer formed on the first and second active regions having a tunnel insulation layer, a trap insulation layer and a blocking insulation layer that are sequentially stacked on the first and second active regions, and a trench including a device pattern isolation at a lower portion of the trench that is positioned between the first and second active regions in the substrate and includes an air gap, the air gap having top defined by at least one of the insulation layers and bottom defined by a layer other than that of the top of the air gap.

In a further embodiment, the air gap has the top defined by the trap insulation layer and the blocking insulation layer, the bottom defined by a portion of the tunnel insulation layer that is formed on the device isolation pattern and side defined by a portion of the tunnel insulation layer that is formed on sidewalls of the trench.

Alternatively, the air gap has the top defined by the trap insulation layer, the bottom defined by a portion of the tunnel insulation layer that is formed on the device isolation pattern and side defined by a portion of the tunnel insulation layer that is formed on sidewalls of the trench.

Alternatively, the air gap has the top defined by the tunnel insulation layer, the bottom defined by a top surface of the device isolation pattern and side defined by sidewalls of the trench.

Lastly, the air gap has the top defined by the tunnel insulation layer and the trap insulation layer, the bottom defined by a top surface of the device isolation pattern, and side defined by sidewalls of the trench.

BRIEF DESCRIPTION OF THE DRAWINGS

Exemplary embodiments will be more clearly understood from the following detailed description taken in conjunction with the accompanying drawings.

DETAILED DESCRIPTION OF THE EMBODIMENTS

Figure 1:
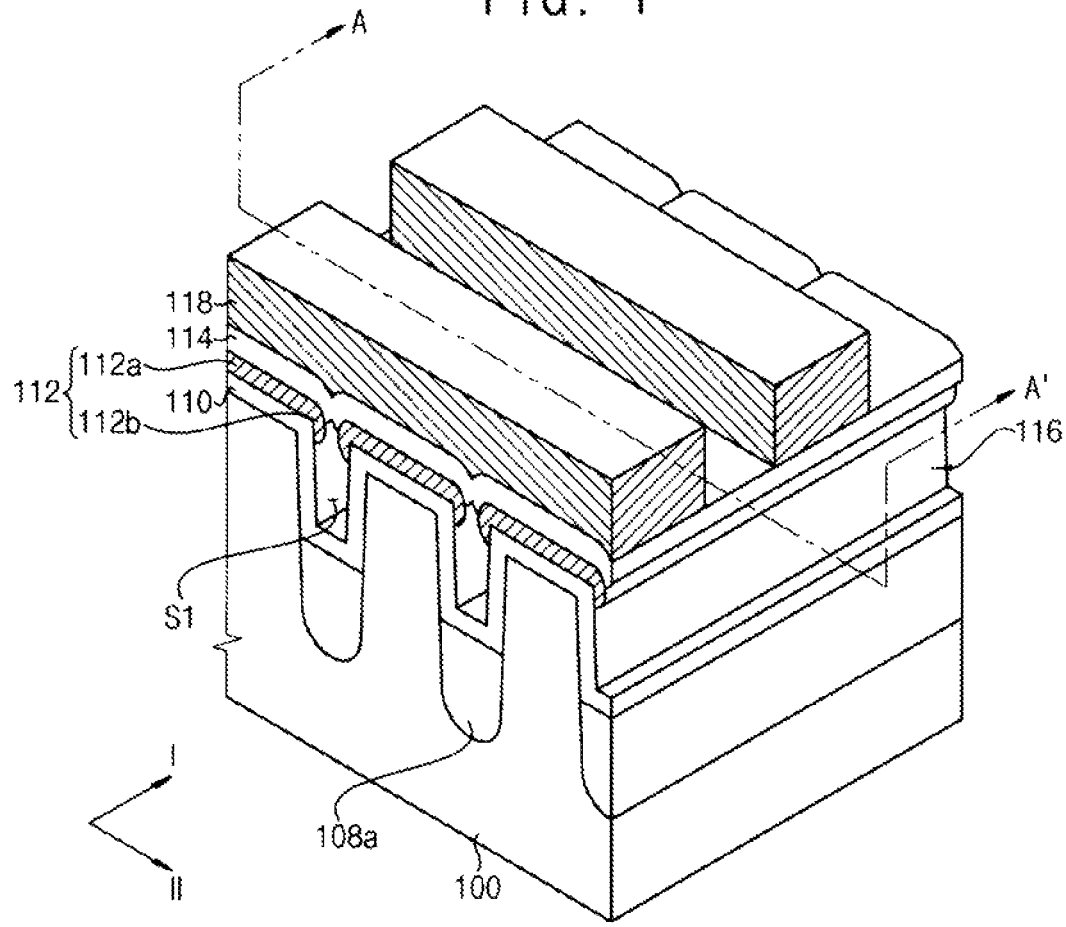
FIG. 1 is a perspective view of a charge trap non-volatile memory device according to a first embodiment of the present inventive concept.

Exemplary embodiments will be described more fully hereinafter with reference to the accompanying drawings. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
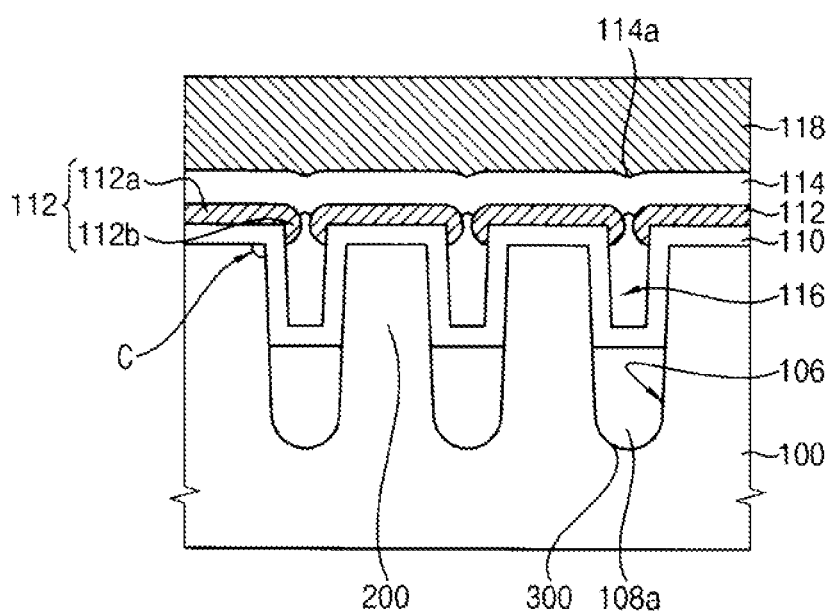
FIG. 2 is a cross-sectional view of the charge trap non-volatile memory device along with the line A-A' of FIG. 1 according to an embodiment of the inventive concept.

FIG. 1 is a perspective view of a charge trap non-volatile memory device according to a first embodiment of the present inventive concept. FIG. 2 is a cross-section view of the charge trap non-volatile memory device along with the line A-A' of FIG. 1 according to the first embodiment of the inventive concept.

Referring to FIGS. 1 and 2, the charge trap non-volatile memory device may include an active region 200, an isolation region 300, memory cell layers 110, 112 and 114. The active region 200 and the isolation region 300 may be formed in a substrate 100. The active region 200 may be positioned between two neighboring isolation regions 300. The isolation region 300 may include a device isolation trench 106 and an air gap 116. The device isolation trench 106 may extend in a first direction I and a plurality of the trenches 106 arrange in a second direction II perpendicular to the first direction I. A sidewall of the trench 106 may be straight or linear from a top to bottom of the trench in such a configuration that width of the trench 106 may gradually decrease with increasing depth. The trench 106 may have a rounded end at the bottom of the trench. Since the width of the trench 106 may gradually decrease with increasing depth, a corner angle C between an upper surface of the active region 200 and a sidewall of the trench 106 may be larger than 90°.

The air gap 116 may have a first side and a bottom defined by a tunnel insulation layer 110 on the trench and a top defined by a trap insulation layer 112 and a blocking insulation layer 114. The air gap 116 may be filled with air, which is known as having the lowest dielectric constant except vacuum. As a result, the air gap 116 of the isolation region 300 may reduce parasitic capacitance between neighboring active regions 200 due to the low dielectric constant.

The isolation region 300 may also include a device isolation pattern 108a. The device isolation pattern 108a may be positioned at a lower portion of the trench 106 and an upper surface of the device isolation pattern 108a may be lower than the upper surface of the substrate 100 of the active region 200. As a result, the isolation region 300 may include the air gap 116 and the device isolation pattern 108a and a lateral portion of the air gap 116 may be conformal to the straight sidewall of the trench 106, especially to the sidewall of the upper portion of the trench 106. That is, the lateral portion of the air gap 116 may also be straight or linear. The air gap 116 and device isolation pattern 118a may run along the device isolation trench 106 between the neighboring active regions 200. The air gap 116 positioned between the active regions 200 at upper portion of the isolation region 300 may sufficiently reduce the parasitic capacitance between the neighboring active regions 200, and the device isolation pattern positioned at lower portion of the isolation region 300 may electrically isolate two neighboring active regions 200.

The memory cell layers 110, 112 and 114 may include a tunnel insulation layer 110, a trap insulation layer 112 and a blocking insulation layer 114. The memory cell layer 110, 112 and 114 on the active region 200 may function as a memory storage cell of a non-volatile memory. The tunnel insulation layer 110 may be conformally formed on the active region 200 of the substrate 100, sidewalls of the device isolation trench 106 and the device isolation pattern 108a. The tunnel insulation 110 does not fill the device isolation trench 106. The tunnel insulation layer 110 may be an insulation layer having a low dielectric constant such as silicon oxide, silicon oxynitride, and doped polysilicon.

The thickness of the tunnel insulation layer 110 may also affect the parasitic capacitance of the insulation region 300 because the thickness may determine width of the air gap defined by sidewalls of the tunnel insulation layer 110 inside the device isolation trench 106. The larger width of the air gap may lead to the less parasitic capacitance of the isolation region 300.

For example, the trench 106 has a width below about 50 nm, and more particularly, below about 20 nm. When the width of the trench 106 may be less than about 20 nm, the air gap 116 may have a width of about a few nanometers.

The trap insulation layer 112 may be positioned on a part of the tunnel insulation layer 110, including an active trap insulation layer 112a and a field trap insulation layer 112b. The field trap insulation layer 112b may have a portion having thickness larger than that of the active trap insulation layer 112a. The active trap insulation layer 112a may be positioned on a top surface of the tunnel insulation layer 110 that may be formed on the active region 200. The field trap insulation layer 112b may be positioned at the corner of the tunnel insulation layer 110 and may not be positioned on the remaining portion of the tunnel insulation layer 110 that may be formed on the sidewalls of the device isolation trench 106. Two neighboring trap insulation layer 112 may do not meet each other. The field trap insulation layers 112b of the two neighboring trap insulation layer 112 may do not meet one another. The shortest distance between the two neighboring field trap insulation layers 112b may be smaller than a distance between facing sidewalls of the tunnel insulation layer 110 at an upper portion of the trench 106. The amount of charges trapped in the trap insulation layer 112 may determine one of data states of a memory cell: a data-on state and a programmed state.

The trap insulation layer 112 may be a layer having a high dielectric constant such as silicon nitride, silicon oxynitride, hafnium silicon oxide, aluminum oxide and hafnium oxide. The dielectric constant of the trap insulating layer 112 may be higher than that of the tunnel insulation layer.

A blocking insulation layer 114 may be positioned on the trap insulation layer 112 that may be disconnected to each other, enclosing the gap between the neighboring two trap insulation layers to form the air gap that may be filled with air and enclosed by the tunnel insulation layer 110, the second trap insulation layer 112b and the blocking dielectric layer 114. Air is known as having the lowest dielectric constant except vacuum, so the air gap 116 of the isolation region 300 may reduce interference between neighboring active regions 200 due to its low dielectric constant.

The blocking insulation layer 114 may be a layer of metal oxide having a high dielectric constant. Examples of the metal oxide may include hafnium oxide, titanium oxide, tantalum oxide, aluminum oxide, and zirconium oxide. These may be used alone or in combinations thereof.

A control gate electrode 118 may be positioned on the blocking layer 114 having a sufficiently planarized surface. The control gate electrode 118 may be a line extending in the second direction II and may include high conductive materials. Example of the conductive materials may include a doped polysilicon, a metal, a metal nitride, and a metal silicide. These materials may be used alone or in combinations thereof.

Hereinafter, a method of manufacturing the non-volatile memory devices of FIG. 1 will be described in detail.

FIGS. 3 to 11B are cross-sectional views illustrating a method of manufacturing the non-volatile memory device of FIG. 1.

Figure 3:
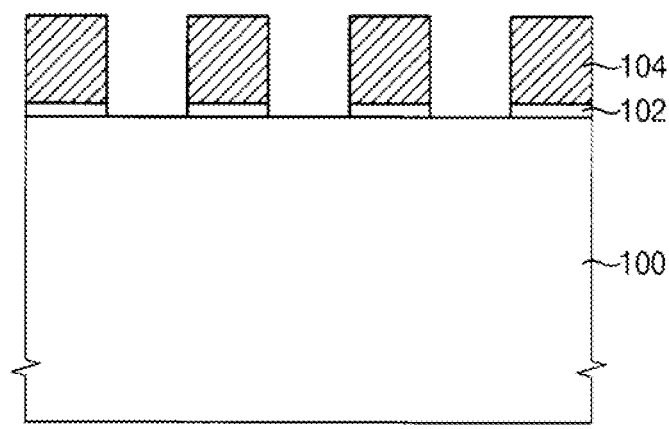
FIGS. 3 to 8, 9A, 9B, 10, 11A and 11B are cross-sectional views illustrating a method of manufacturing the non-volatile memory device of FIG. 1.

FIG. 3 shows a step of forming a hard mask pattern 104 necessary to form a device isolation trench on the substrate 100 according to the first embodiment of the present inventive concept. A buffer oxide layer and a hard mask layer may be sequentially formed on the semiconductor substrate 100 including single crystalline silicon. The buffer oxide layer may be formed by a thermal oxidation process against the substrate 100 and the hard mask layer may be formed by deposition of polysilicon on the buffer oxide layer.

The buffer oxide layer and the hard mask layer may be sequentially patterned to thereby form a buffer oxide pattern 102 and a hard mask pattern 104 that may be extended in the first direction I. The hard mask pattern 104 may function in the subsequent process as a mask pattern for forming a device isolation trench on the substrate 100.

Figure 4:
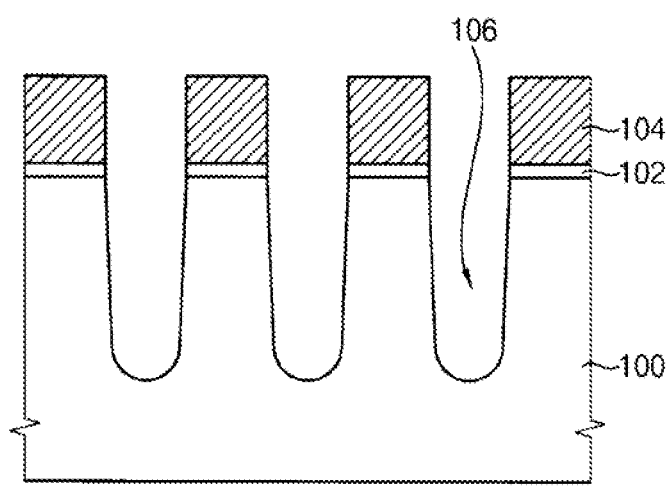

FIG. 4 shows a step of forming a trench 106 using the mask pattern 104 according to the first embodiment of the present inventive concept. The substrate 100 may be partially removed by an anisotropic etching process using the hard mask pattern as an etching mask, to thereby form the trench 106 on the substrate 100. The trench 106 functions as a device isolation region 300 of the substrate 100. A part of the substrate 100 covered with the hared mask pattern 104 may not be removed by the same etching process and may be defined by the two neighboring trenches 106. The part of the substrate 100 may function as an active region of the substrate 100. Under the anisotropic etching process, width of the device isolation trench 106 may gradually decrease with increasing depth. The device isolation trench 106 may also have a rounded end at the bottom of the device isolation trench 106. Thus the sidewall of the device isolation trench 106 may have a certain slope with respect to an upper surface of the substrate 100 and may be straight from a top to a bottom of the trench without any curved portions.

For example, the trench 106 may be formed to have a width below about 50 nm, and more particularly, below about 20 nm.

A sidewall oxide layer (not shown) may be formed on the sidewall of the trench 106 by a thermal oxidation process.

Figure 5:
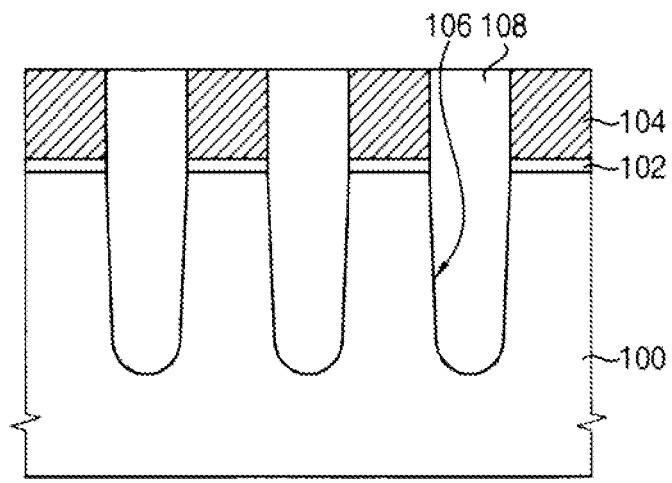
Figure 6:
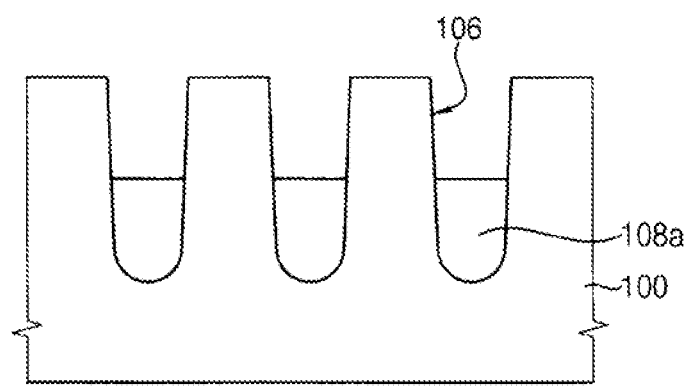

FIG. 5 and FIG. 6 show a step of form an isolation pattern 108a in the trench 106 according to the first embodiment of the present inventive concept. In FIG. 5, an insulation layer having good gap-fill characteristics (not shown) may be formed on the substrate 100 to a sufficient thickness to fill up the trench 106 and a gap between the hard mask patterns 104. For example, the insulation layer is a TOSZ oxide layer deposited using a spin-on coating process. Then, the insulation layer may be planarized until a top surface of the hard mask pattern 104 may be exposed, to thereby form a preliminary device isolation pattern 108 on the substrate 100.

In FIG. 6, the device isolation pattern 108a may be recessed to a predetermined depth of the trench 106. The hard mask pattern 104 may be removed first. Then the buffer oxide pattern 102 and the preliminary device isolation pattern 108 may be subject to an etching process. The preliminary device isolation pattern 108 may be recessed until the buffer oxide pattern 102 may be removed on the substrate 100. The remaining portion of the preliminary isolation pattern 108 may be the device isolation pattern 108a. The height of the device isolation pattern 108a measured from the bottom of the trench 106 may determine a height of the air gap between the neighboring active regions of the substrate 100. That is, the lower the height of the device isolation pattern 108a, the higher the height of the air gap between the active regions.

The resulting structure of FIG. 6 may include the device isolation pattern 108a at the lower portion of the trench 106, and may expose an upper sidewall of the trench 106 and an upper surface of the substrate. The upper portion of the trench 106 corresponding to the recessed portion of the preliminary device isolation pattern 108 may be formed into the air gap 116 in subsequent processes, and thus lateral portions of the air gap 116 may be conformal to the straight sidewall of the upper portion of the trench 106.

Figure 7:
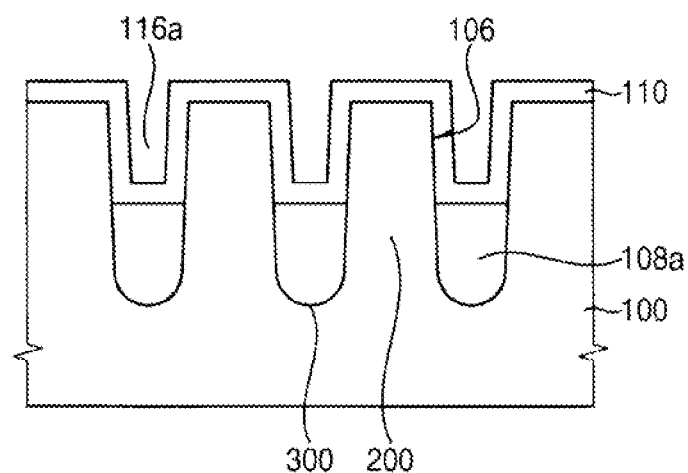

FIG. 7 shows a step of forming a tunnel insulation layer 110 according to the first embodiment of the present inventive concept. The tunnel insulation layer 110 may be conformally formed on the upper surface of the active region 200 of the substrate 100, on the upper sidewall of the trench 106 and on the device isolation pattern 108a, forming an open space 116a between the facing sidewalls of the tunnel insulation layer 100. As the thickness of the tunnel insulation layer 110 increases, the width of the open space 116a decreases. The tunnel insulation layer 110 may be an insulation layer having a low dielectric constant such as silicon oxide, silicon oxynitride, and doped polysilicon. The dielectric constant of the tunnel insulation layer 110 may be larger than that of air, but smaller than that of the trap insulation layer.

Figure 8:
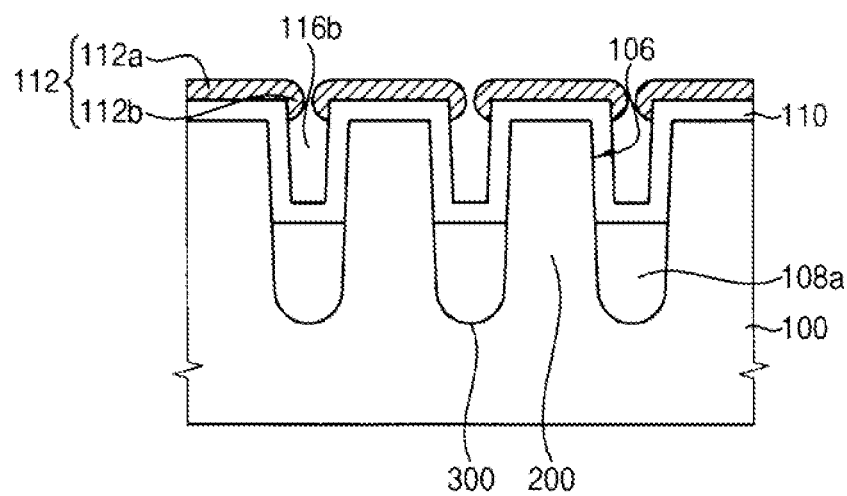
Figure 9A:
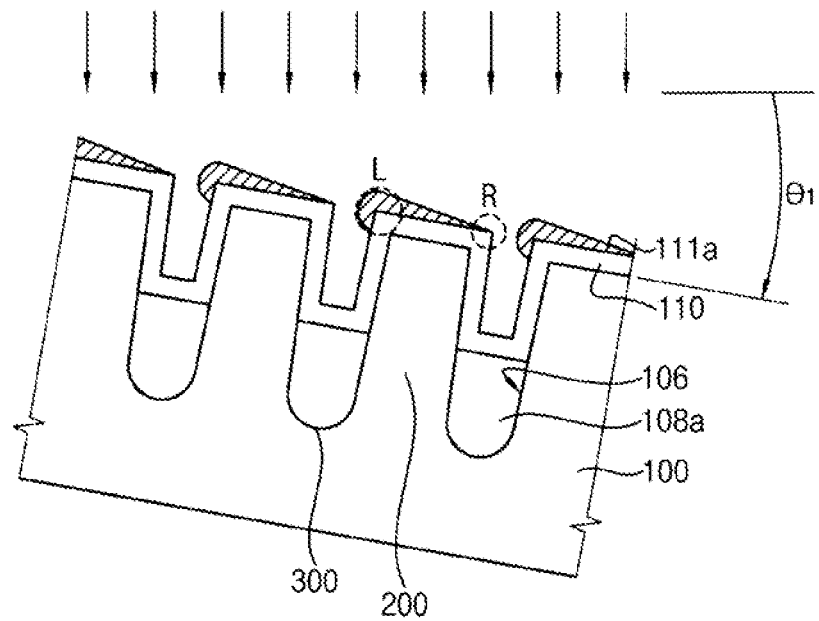
Figure 9B:
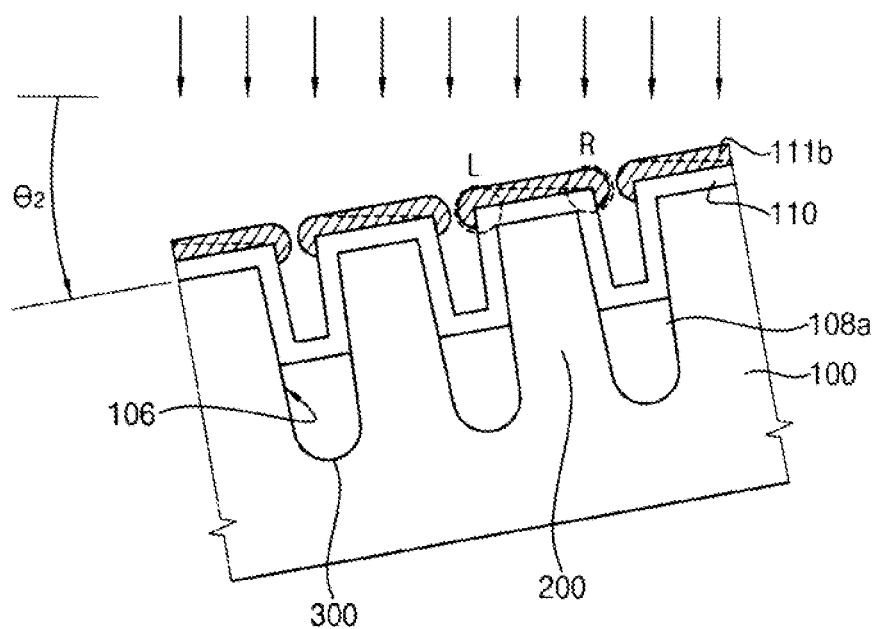

FIG. 8, FIG. 9A and FIG. 9B show a step of forming a trap insulation layer 112 according to the embodiment 1 of the present inventive concept. FIG. 8 shows a resulting structure having the trap insulation layer 112 and an empty space 116b from performing a deposition method explained below using FIGS. 9A and 9B. The trap insulation layer 112 may be a layer having a high dielectric constant such as silicon nitride, silicon oxynitride, hafnium silicon oxide, aluminum oxide and hafnium oxide. The dielectric constant of the trap insulating layer 112 may be higher than that of the tunnel insulation layer.

In FIGS. 9A and 9B, the trap insulation layer 112 of FIG. 8 may be formed by two consecutive deposition steps using a jet deposition process, both by rotating and by tilting a substrate at a predetermined tilt angle according to the first embodiment of the present inventive step. The characteristics of the jet deposition process may be a high degree of directionality of reaction gases to a substrate. The better the directionality, the more collimated the reaction gases, resulting in a deposition layer having poor step coverage and poor conformality.

In a first step of FIG. 9A, the jet deposition process may be carried out while a substrate may be rotated at a first direction, for example, clockwise. The substrate may also be tilted rightward at a first tilt angle θ1, resulting in the highest deposition rate at a left portion L. This difference of the deposition rate may result in a varying thickness of the first trap insulation layer 111a that decrease from a left portion L to a right portion R of the substrate 100. Particularly, the first trap insulation layer 111a may have the largest thickness around the corner of the left portion L. Due to the high directionality and tilting the substrate, few reaction gases for depositing the first trap insulation layer 111a may hit the lower portion of the trench 106. The reaction gases, if any, may not form a layer at the lower portion of the trench 106.

After a formation of the first trap insulation layer 111a, the second step of FIG. 9B may be carried out under a different arrangement of the substrate. For example, the substrate 100 may be rotated at a second direction of counterclockwise. The substrate 100 may also be tilted leftward at a second tilt angle θ2, resulting in the highest deposition rate at a right portion R. Particularly, the second trap insulation layer 111b has the largest thickness around the corner of the right portion R. Due to the high directionality and tilting the substrate, few reaction gases for depositing the second trap insulation layer 111b hit the lower portion of the trench 106. The reaction gases, if any, do not form a layer at the lower portion of the trench 106. The thickness distribution of the first and second insulation layers 111a and 111b may be controlled to form a uniform thickness distribution of the combined first and second trap insulation layers 111a and 111b on a top surface of the tunnel insulation layer 110. The first and second trap insulation layers 111a and 111b may merely be formed at the corner portions L and R of the trench 106 and the top surface of the tunnel insulation layer other than the lower portion of the trench 106. As a result, the combined first and second trap insulation layers 111a and 111b may be disconnected at every device isolation region 300 of the substrate 100.

Due to the tilting of the substrate 100, the deposition source gases, even though they have a high degree of directionality to the substrate 100, may not be deposited on the tunnel insulation layer 110 that may be formed at the lower portion of the trench 106, resulting in the empty space 116b.

Figure 10:
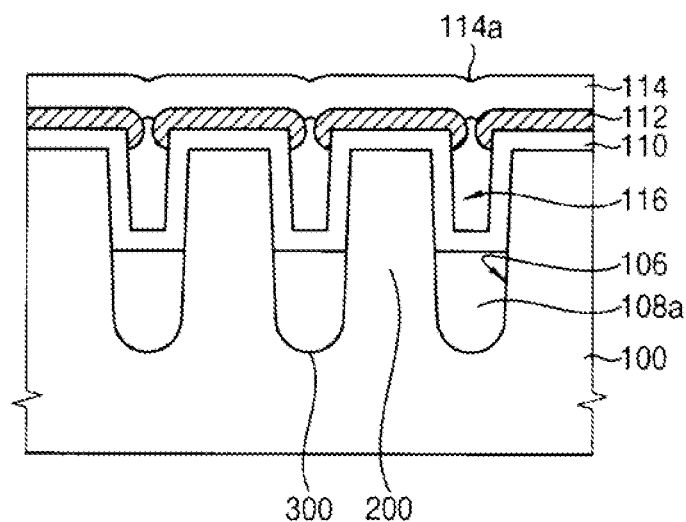
Figure 11A:
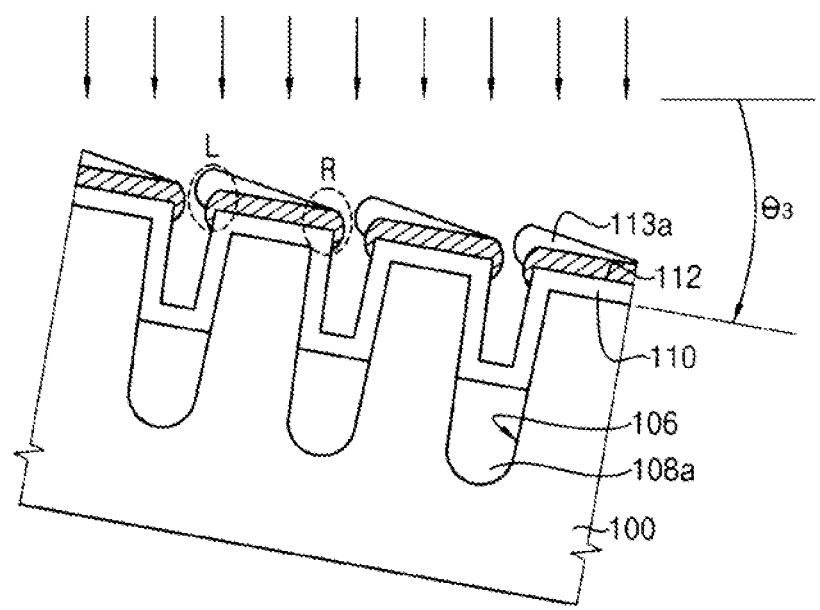
Figure 11B:
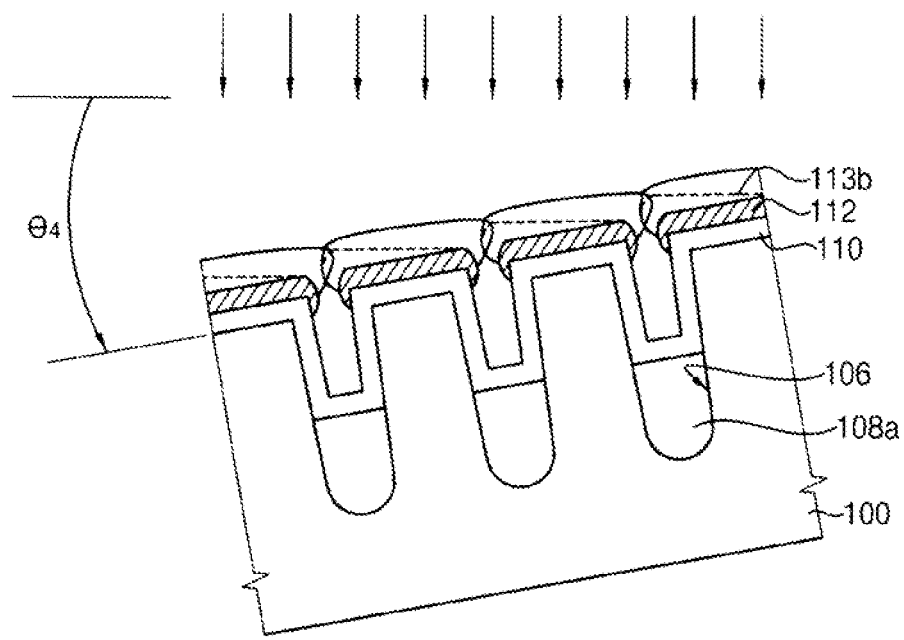

FIG. 10, FIG. 11A and FIG. 11B show a step of forming a blocking insulation layer 114 according to the first embodiment of the present inventive concept. FIG. 10 shows a resulting structure having the blocking insulation layer 114 and an air gap 116 from performing a deposition method explained below using FIGS. 11A and 11B. The blocking insulation layer 114 may be a layer of metal oxide having a high dielectric constant. Examples of the metal oxide include hafnium oxide, titanium oxide, tantalum oxide, aluminum oxide, and zirconium oxide. These may be used alone or in combinations thereof.

In FIGS. 11A and 11B, the blocking insulation layer 112 of FIG. 10 may be formed using a deposition method used in forming the trap insulation layer 112 explained above. The deposition method includes two consecutive deposition steps using a jet deposition process, both by rotating and by tilting a substrate at a predetermined tilt angle according to the first embodiment of the present inventive step. The characteristics of the jet deposition process may be a high degree of directionality of reaction gases to a substrate. The better the directionality, the more collimated the reaction gases, resulting in a deposition layer having poor step coverage and poor conformality.

In a first step of FIG. 9A, the jet deposition process may be carried out when a substrate may be rotated at a first direction of clockwise. The substrate may also be tilted rightward at a third tilt angle θ3, resulting in the highest deposition rate at a left portion L. This difference of the deposition rate results in a thickness distribution of the first blocking insulation layer 113a that decrease from a left portion L to a right portion R of the substrate 100. Particularly, the first blocking insulation layer 113a has the largest thickness around the corner of the left portion L. Due to the high directionality and tilting the substrate, few reaction gases for depositing the first blocking insulation layer 113a hit the lower portion of the round corner of the trap insulation layer 112 and the tunnel insulation layer 110 that may be form on the lower portion of the trench 106. The reaction gases, if any, do not form a deposition layer on the lower portion of the round corner of the trap insulation layer 112 and the tunnel insulation layer 110 that may be formed on the lower portion of the trench 106.

After a formation of the first blocking insulation layer 111a, the second step of FIG. 11B may be carried out under a different arrangement of the substrate 100. For example, the substrate 100 may be rotated at a second direction of counterclockwise. The substrate 100 may be also tilted leftward at a second tilt angle θ4, resulting in the highest deposition rate at a right portion R. Particularly, the second blocking insulation layer 113b has the largest thickness around the corner of the right portion R. Due to the high directionality and tilting the substrate, few reaction gases for depositing the second blocking insulation layer 113b hit the lower portion of the trench 106. The reaction gases, if any, do not form a layer at the lower portion of the trench 106. The thickness distribution of the first and second blocking insulation layers 113a and 113b may be controlled to form a uniform thickness distribution of the combined first and second trap insulation layers 114 on a top surface of the trap insulation layer 112. The first and second trap insulation layers 111a and 111b may merely be formed at the corner portions L and R and the top surface of the trap insulation layer 112 other than the tunnel insulation layer 110 that may be form on the lower portion of the trench 106. As a result, the blocking insulation layer 114 of combined first and second blocking insulation layers 113a and 113b may forms continuous layer with a recess 114a.

The recess 114a may be formed at a region corresponding to the gap between neighboring two trap insulation layers 112. The recess 114a may result from the gap between the two neighboring trap insulation layers 112.

Due to the tilting of the substrate 100, the deposition source gases, even though they have a high degree of directionality to the substrate 100, may not be deposited on the tunnel insulation layer 110 that may be formed at the lower portion of the trench 106. The corners L and R of the trap insulation layer 114 may have the highest deposition rate on the first and second trap insulation layers 113a and 113b, resulting in enclosing the gap between two neighboring trap insulation layers 112. This enclosure may block deposition gases from arriving on the tunnel insulation layer 110 in the trench 106, resulting in the air gap 116.

Referring again FIGS. 1 and 2, a control gate layer (not illustrated) may be formed on the blocking dielectric layer 114 and a second mask pattern (not illustrated) may be formed on the control gate layer. The second mask pattern extends in the second direction II.

The control gate layer may be partially removed from the blocking dielectric layer 114 by an etching process using the second mask pattern as an etching mask, thereby forming the control gate electrode 118 on the blocking dielectric layer 114. The control gate electrode 118 may include a doped polysilicon, a metal, a metal nitride, and a metal silicide. These may be used alone or in combinations thereof. In the present example embodiment, the control gate electrode 118 a multi-layered electrode, in which a tungsten layer may be stacked on a tungsten nitride layer.

Accordingly, the non-conformal deposition for the trap insulation layer and the blocking dielectric layer may facilitate the formation of the air gap in the trench of the device isolation region of the substrate.

Figure 12:
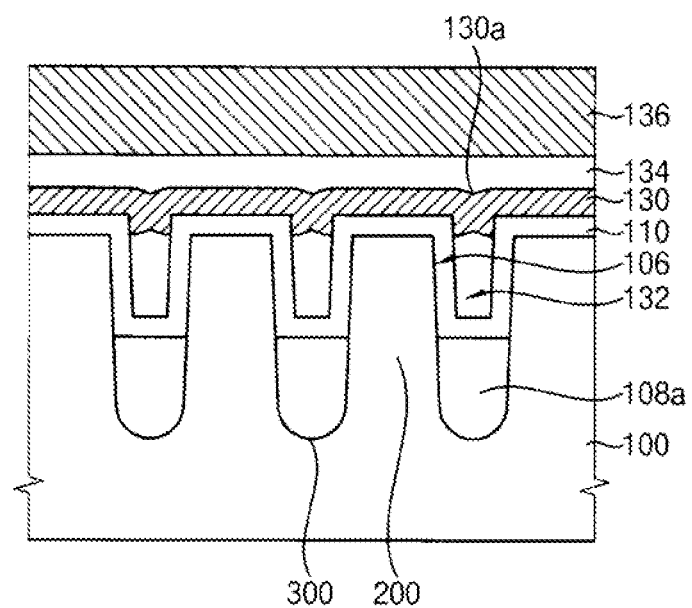
FIG. 12 is a cross-sectional view illustrating a charge trap non-volatile memory device according to an example embodiment of the present inventive concept.

FIG. 12 is a cross-sectional view illustrating a charge trap non-volatile memory device according to a second example embodiment of the present inventive concept.

The charge trap non-volatile memory device of the second embodiment may have the same structure as that of the first embodiment, except for the shape of the trap insulation layer and the air gap. Thus, the tunnel insulation layer, the trap insulation layer and the blocking dielectric layer of the second embodiment may have the same materials as those in the first embodiment.

Referring to FIG. 12, the substrate 100 may be prepared and a device isolation region 300 and an active region 200 may be defined on the substrate 100. The device isolation trench 106 may be prepared in the device isolation region 300 of the substrate 100 and width of the trench 106 may decrease with increasing depth of the trench 106. The trench 106 may have a straight sidewall from a top to a bottom thereof and a width of the trench 106 may decrease with increasing depth. Thus, a corner angle between an upper surface of the active region 200 and the straight sidewall of the upper portion of the trench 106 may be larger than about 90°.

The device isolation pattern 108a may be positioned at a lower portion of the trench 106 in such a configuration that an upper surface of the device isolation pattern 108a may be lower than the upper surface of the substrate 100 in the active region 200. The tunnel insulation layer 110 may be positioned on the upper surface of the active region 200 of the substrate 100, on the upper sidewall of the trench 106 and on the device isolation pattern 108a. That is, the tunnel insulation layer 110 may be conformal to the trench 106 on the substrate 100 and may not be filled up with the tunnel insulation layer 110.

The trap insulation layer 300 of the second embodiment may be continuously arranged over the isolation region 300, resulting in enclosing an air gap 132 between the trap insulation layer 300 and the tunnel insulation layer 110. The air gap 116 may have a first side and a bottom defined by a tunnel insulation layer 110 on the trench and a top defined by the trap insulation layer 300. The air gap 132 may be filled with air, which is known as having the lowest dielectric constant except vacuum. As a result, the air gap 132 of the isolation region 300 may reduce parasitic capacitance between neighboring active regions 200 due to the low dielectric constant.

The trap insulation layer 300 may have a recess 300a, resulting in non-uniform thickness arising from the air gap 132. The recess 300a forms at a region corresponding to the center of the air gap 132.

A blocking dielectric layer 134 may be arranged on the trap insulation layer 300 and may make contact with a whole surface of the trap insulation layer 300. The blocking dielectric layer 134 may be conformal to a shape of an upper surface of the trap insulation layer 300.

Hereinafter, a method of manufacturing the non-volatile memory device illustrated in FIG. 12 will be described in detail with reference to FIGS. 13 to 14.

The device isolation pattern 108a and the tunnel insulation layer 110 may be formed on the substrate 100 including the device isolation trench 106 through the same process steps as described with reference to FIGS. 3 to 7, thereby forming the structure on the substrate 100 as illustrated in FIG. 7.

Figure 13:
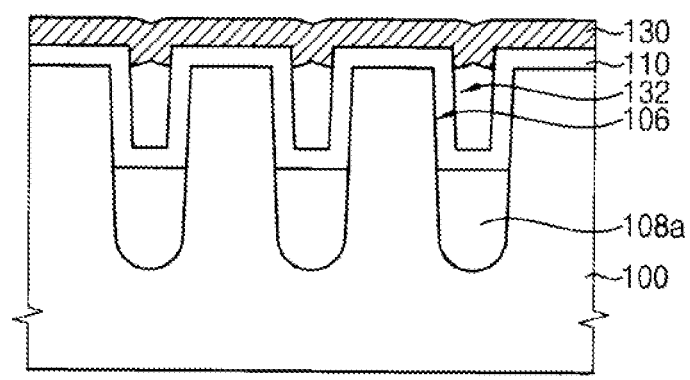
FIGS. 13 and 14 are cross-sectional views illustrating a method of manufacturing the non-volatile memory device of FIG. 12.

FIG. 13 shows a step of forming a trap insulation layer 300 on the tunnel insulation layer 110 by the two-consecutive deposition method using a jet deposition process. Unlike the first embodiment where the trap insulation layer 112 forms only on the tunnel insulation layer 110 on the active region 200, the trap insulation layer 300 of the second embodiment may be formed over the insulation region 200, resulting in forming the air gap 132.

Like explained with reference to FIGS. 9A and 9B, the jet deposition process may form a first trap insulation layer 111a and the second trap insulation layer 111b on the tunnel insulation layer 110 of the active region 200. In FIGS. 9A and 9B, the left portion L may be connected to the right portion R adjacent to the left portion L by controlling the tilt angles θ1, θ2, θ3 and θ4. This merged structure of the trap insulation layer 300 from the first and second insulation layers 111a and 111b may result in the air gap 132 and a recess 300a at a region corresponding to the center of the air gap 132.

Figure 14:
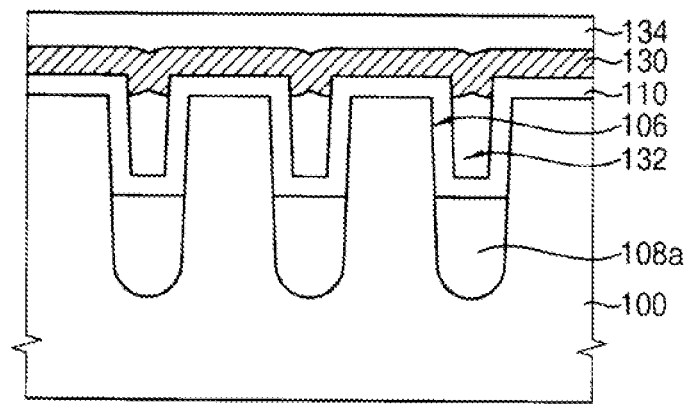

FIG. 14 show a step of form a blocking dielectric layer 134 on the trap insulation layer 300 and may be sufficiently conformal to a surface profile of the trap insulation layer 300.

Thereafter, as illustrated in FIG. 12, a control gate layer may be formed on the blocking dielectric layer 134 and may be patterned into a control gate electrode 136.

Figure 15:
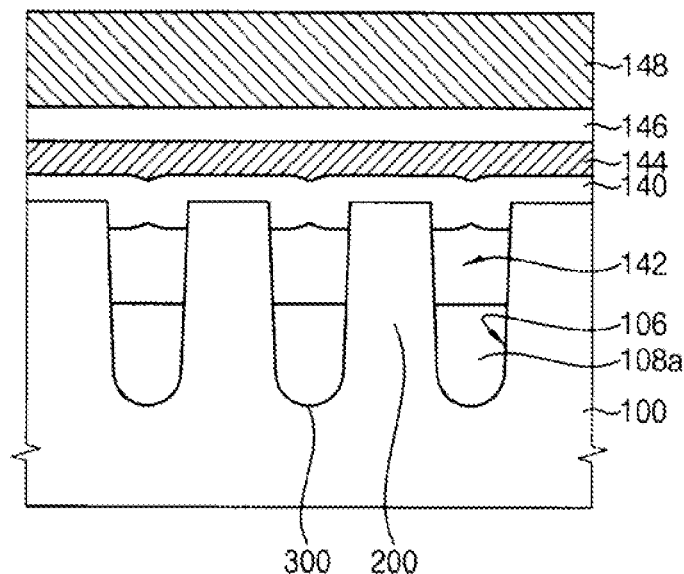
FIG. 15 is a cross-sectional view illustrating a charge trap non-volatile memory device according to an embodiment of the present inventive concept.

FIG. 15 is a cross-sectional view illustrating a charge trap non-volatile memory device according to a third embodiment of the present inventive concept.

The charge trap non-volatile memory device of the third embodiment may have the same structure as that of the first embodiment, except for the shape of the tunnel insulation layer, the trap insulation layer and the air gap. Thus, the tunnel insulation layer, the trap insulation layer and the blocking dielectric layer of the third embodiment may have the same materials as those of the first embodiment.

Referring to FIG. 15, the substrate 100 may be prepared and a device isolation region 300 and an active region 200 may be defined on the substrate 100. The device isolation trench 106 may be prepared in the device isolation region 300 of the substrate 100 and width of the trench 106 may decrease with increasing depth of the trench 106. The trench 106 may have a straight sidewall from a top to a bottom thereof and a width of the trench 106 may decrease with increasing depth. Thus, a corner angle between an upper surface of the active region 200 and the straight sidewall of the upper portion of the trench 106 may be larger than about 90°.

The device isolation pattern 108a may be positioned at a lower portion of the trench 106 in such a configuration that an upper surface of the device isolation pattern 108a may be lower than the upper surface of the substrate 100 in the active region.

The tunnel insulation layer 140 may be formed over the insulation region 200, resulting in forming the air gap 142. In the first and second embodiments, the tunnel insulation layer 110 may be conformally formed on the substrate 100, A trap insulation layer 144 may be arranged on the tunnel insulation layer 140 and make contact with a whole surface of the tunnel insulation layer 140. The trap insulation layer 144 may be conformal to a shape of an upper surface of the tunnel insulation layer 140.

A blocking dielectric layer 146 may be arranged on the trap insulation layer 144 and may make contact with a whole surface of the trap insulation layer 144. The blocking dielectric layer 146 may be conformal to a shape of an upper surface of the trap insulation layer 144.

A control gate electrode 148 may be arranged on the blocking dielectric layer 146. Since an upper surface of the blocking dielectric layer 146 may be sufficiently flat, a lower surface of the control gate electrode 148 may also be sufficiently flat. For example, the control gate electrode 148 may be shaped into a line extending in the second direction II perpendicular to the active region extending in the first direction I.

Hereinafter, a method of manufacturing the non-volatile memory device illustrated in FIG. 15 will be described in detail with reference to FIGS. 16 to 17.

Figure 16:
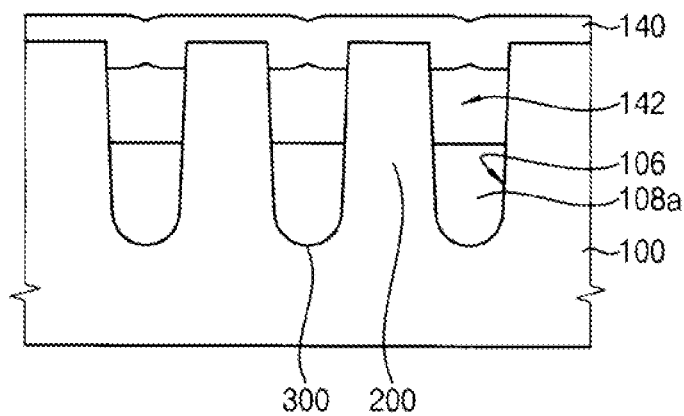
FIGS. 16 and 17 are cross-sectional views illustrating a method of manufacturing the non-volatile memory device of FIG. 15.
Figure 17:
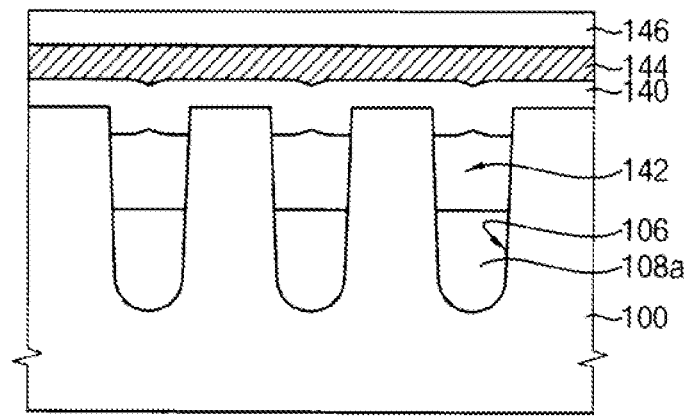

FIGS. 16 and 17 are cross-sectional views illustrating a method of manufacturing the non-volatile memory device of FIG. 15.

The device isolation pattern 108a may be formed on the substrate 100 including the device isolation trench 106 through the same process steps as described with reference to FIGS. 3 to 6, thereby forming the structure on the substrate 100 as illustrated in FIG. 6.

FIG. 16 shows a step of forming a tunnel insulation layer 140 using a two-consecutive deposition method using a jet deposition process. Unlike the first embodiment where the tunnel insulation layer 110 may conformally be deposited on the substrate 100, the tunnel insulation layer 140 of the third embodiment may be deposited over the insulation region 200, resulting in forming the air gap 142.

The tunnel insulation layer 140 may be deposited by a two-consecutive deposition process using a jet deposition process similar to that used in the second embodiment. The same mechanism explained with reference to FIG. 13 applies. The tunnel insulation layer 140 may only be deposited on the active region due to the high degree of directionality of reaction gases and the tilting of the substrate. The tunnel insulation layer 140 may partly be deposited on the active regions connects to one another when the tunnel insulation layer 140 on the active regions extends toward the insulation regions 300. This merged structure of the insulation layer 140 may result in the air gap 132 and a recess 140a at a region corresponding to the center of the air gap 142.

FIG. 17 may show a step of depositing a trap insulation layer 144 and a blocking insulation layer according to the third embodiment of the present inventive concept. The trap insulation layer 144 may be formed on the tunnel insulation layer 140 and may be sufficiently conformal to a surface profile of the tunnel insulation layer 140. The blocking dielectric layer 146 may be formed on the trap insulation layer 144 and may be sufficiently conformal to a surface profile of the trap insulation layer 144.

Thereafter, as illustrated in FIG. 15, a control gate layer may be formed on the blocking dielectric layer 146 and may be patterned into a control gate electrode 148.

Figure 18:
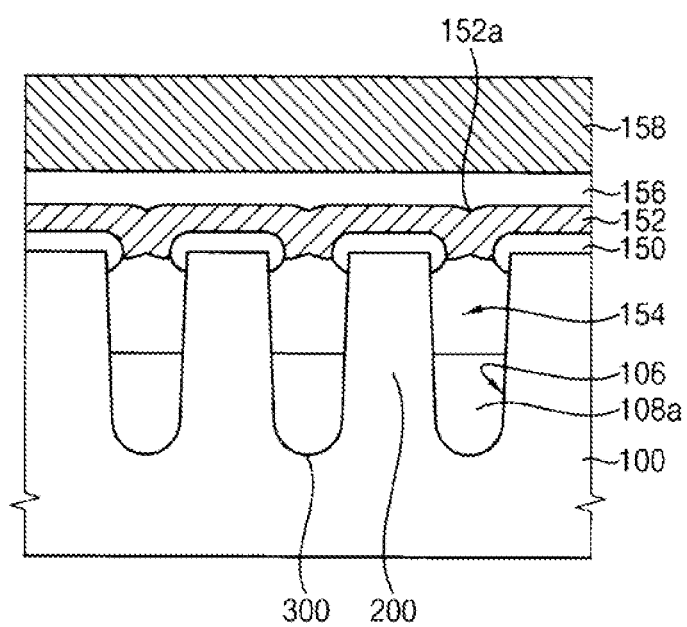
FIG. 18 is a cross-sectional view illustrating a charge trap non-volatile memory device according to an embodiment of the present inventive concept.

FIG. 18 is a cross-sectional view illustrating a charge trap non-volatile memory device according to a fourth example embodiment of the present inventive concept.

The charge trap non-volatile memory device of the fourth embodiment may have the same structure as that of the third embodiment, except for the shape of the tunnel insulation layer and the trap insulation layer.

Referring to FIG. 18, the substrate 100 may be prepared and a device isolation region 300 and an active region area 200 may be defined on the substrate 100. The device isolation trench 106 may be prepared in the device isolation region 300 of the substrate 100 and width of the trench 106 may decrease with increasing depth of the trench 106.

The device isolation pattern 108a may be positioned at a lower portion of the trench 106 in such a configuration that an upper surface of the device isolation pattern 108a may be lower than the upper surface of the substrate 100 in the active region.

A tunnel insulation layer 150 may be positioned on the upper surface of the active region of the substrate 100 and on the upper sidewall of the trench 106. The tunnel insulation layer 150 at the active region 200 may have a thickness different from that of the tunnel insulation layer 150 at the device isolation region 300. The tunnel insulation layer 150 may be disconnected to one another at the device isolation region 300 of the substrate 100 and may extend in the first direction I in parallel with the active region 200 of the substrate 100.

A trap insulation layer 152 may be continuously arranged on the tunnel insulation layer 150, resulting in an air gap 154 and a recess 152a. The air gap 154 may have a first side defined by sidewalls of the device isolation trench 106, a bottom defined by a top surface of the device isolation pattern 108a, and a top defined by the trap insulation layer 300 and a bottom portion of the tunnel insulation layer 150. The air gap 132 may be filled with air, which is known as having the lowest dielectric constant except vacuum. As a result, the air gap 132 of the isolation region 300 may reduce parasitic capacitance between neighboring active regions 200 due to the low dielectric constant.

The trap insulation layer 152 may have a recess 152a, resulting in non-uniform thickness arising from the air gap 154. The recess 152a may be formed at a region corresponding to the center of the air gap 154. A blocking dielectric layer 156 may be arranged on the trap insulation layer 152 that may be conformal to a surface profile of the trap insulation layer 152.

A control gate electrode 158 may be arranged on the blocking dielectric layer 156. Since an upper surface of the blocking dielectric layer 156 may be sufficiently flat, a lower surface of the control gate electrode 158 may also be sufficiently flat. For example, the control gate electrode 158 may be shaped into a line extending in the second direction II perpendicular to the active region extending in the first direction I.

Hereinafter, a method of manufacturing the non-volatile memory device illustrated in FIG. 18 will be described in detail with reference to FIGS. 19 to 20.

Figure 19:
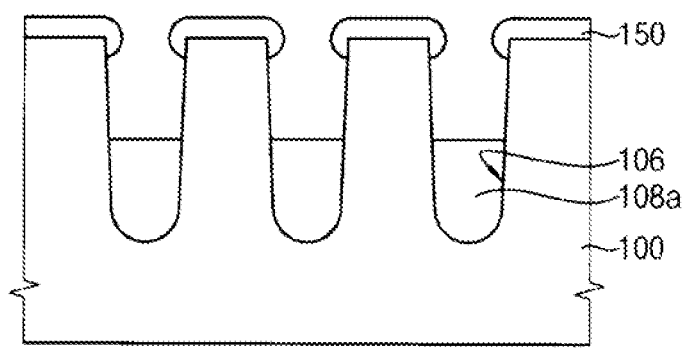
FIGS. 19 and 20 are cross-sectional views illustrating a method of manufacturing the non-volatile memory device of FIG. 18.
Figure 20:
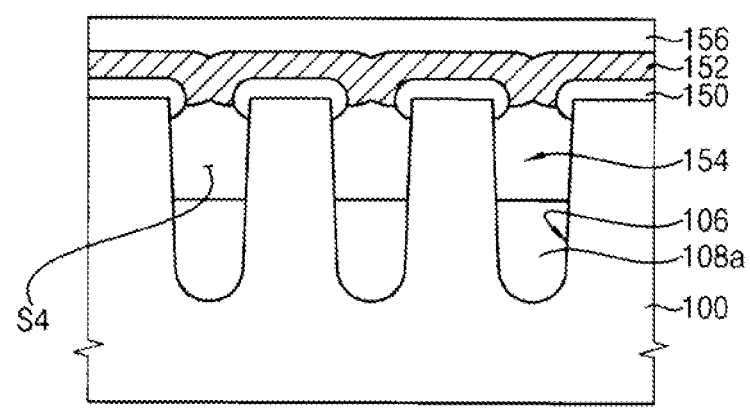

FIGS. 19 and 20 are cross-sectional views illustrating a method of manufacturing the non-volatile memory device of FIG. 18.

The device isolation pattern 108a may be formed on the substrate 100 including the device isolation trench 106 through the same process steps as described with reference to FIGS. 3 to 6, thereby forming the structure on the substrate 100 as illustrated in FIG. 6.

FIG. 19 shows a step of forming a tunnel insulation layer 150 using a two-consecutive deposition method using a jet deposition process. Due to the directionality of the jet deposition process and tilting the substrate at a predetermined tilt angle, the tunnel insulation layer 150 may be formed on the upper surface of the active region 200 and on the upper sidewall of the trench 106. Thus, the tunnel insulation layer 150 may be disconnected to one another at the device isolation region 300 of the substrate 100.

FIG. 20 shows a step of forming a trap insulation layer 152 using a two-consecutive deposition method using a jet deposition process. Like explained with reference to FIGS. 9A and 9B, the jet deposition process may form a first trap insulation layer 111a and the second trap insulation layer 111b on the tunnel insulation layer 110 of the active region 200. In FIGS. 9A and 9B, the left portion L may be connected to the right portion R adjacent to the left portion L by controlling the tilt angles θ1, θ2, θ3 and θ4. This merged structure of the trap insulation layer 152 of FIG. 20 from the first and second insulation layers 111a and 111b may result in the air gap 154 and a recess 152a at a region corresponding to the center of the air gap 154.

A blocking dielectric layer 156 may be formed on the trap insulation layer 154 and may be sufficiently conformal to a surface profile of the trap insulation layer 154.

Thereafter, as illustrated in FIG. 18, a control gate layer may be formed on the blocking dielectric layer 156 and may be patterned into the control gate electrode 158.

The above-described non-volatile memory devices may be installed to various electronic systems.

Figure 21:
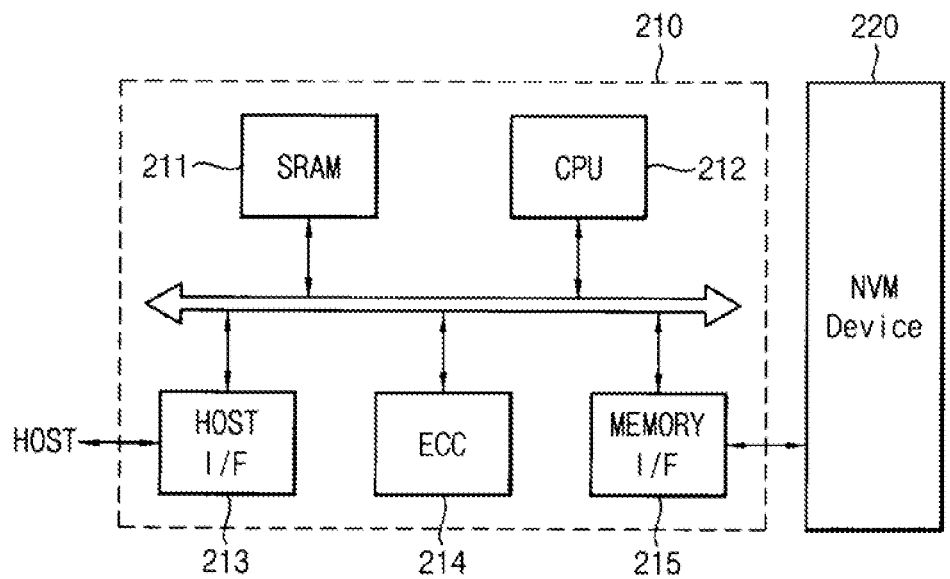
FIG. 21 is a block diagram illustrating a memory system according to an embodiment of the present inventive concept.

FIG. 21 is a block diagram illustrating a memory system according to an embodiment of the present inventive concept. The memory system 200 may include a memory controller 210 and a non-volatile memory device 220 electrically connected to the memory controller 210.

The memory controller 210 may control the operation of the non-volatile memory device 220. For example, the memory controller 210 may include a static random access memory (SRAM) device 211, a central process unit (CPU) 212, a host interface 213, an error correction block (ECB) 214 and a memory interface 215.

The DRAM device 211 may function as an operational memory device for the CPU 212. The host interface 213 may include a protocol for communicating data with a host center that may be positioned outside the memory system 200 and electrically connected to the memory system 200. The ECB 214 may detect errors from the data read from the non-volatile memory device 220 and may correct the detected errors. The memory interface 215 may communicate data with the non-volatile memory device 220. Various operations of the memory controller 210 may be performed by the CPU 212. Although not illustrated in FIG. 21, a read-only memory (ROM) device may be further provided to the memory system 200. For example, the ROM device may include a set of code data for encryption and decryption when communicating data between the exterior host center and the memory system 200.

The non-volatile memory device 220 may include a single memory chip and a multi-chip package having a plurality of the memory chips. The memory chip may include any one of the above-described example embodiments of the non-volatile memory devices of the present invention, and thus any detailed descriptions on the memory chip will be omitted. Particularly, when a plurality of flash memory devices may be provided with the non-volatile memory device 220, the memory system 200 may be used as a storage system such as a solid state disk (SSD). In such a case, the memory controller 210 may communicate data with exterior host center via various protocol interfaces such as USB, MMC, PCI-E, SAS, SATA, PATA, SCSI, ESDI and IDE. In addition, the memory controller 210 for the SSD may further include a random operator for random arithmetic calculations.

Figure 22:
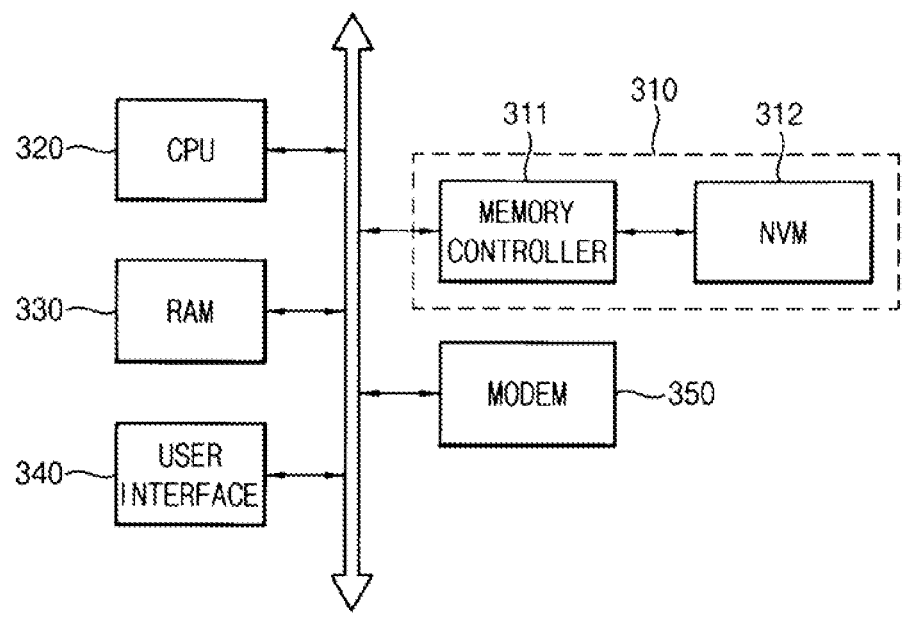
FIG. 22 is a schematic block diagram illustrating a computing system including the memory system of FIG. 21 according to an embodiment of the present inventive concept.

FIG. 22 is a schematic block diagram illustrating a computing system including the memory system of FIG. 21 according to an embodiment of the present inventive concept. The computing system 300 may include a memory system 310, a microprocessor 320 electrically connected to a system bus 360, a random access memory (RAM) unit 330, a user interface 340 and a MODEM 350 such as a baseband chipset. The memory system 310 may have the same structure as the memory system 200 of FIG. 21. The computing system 300 may be provided as a mobile system and a battery may be further installed to the mobile computing system. In addition, the mobile computing system may further include an application chipset, a camera image processor (CIS) and a mobile DRAM.

The memory system 310 may include a single memory chip and a multi-chip package having a plurality of the memory chips. The memory chip may include any one of the above-described example embodiments of the non-volatile memory devices of the present invention.

According to the embodiments of the present inventive concept, signal interference between neighboring memory cells may be minimized in the non-volatile memory device, thereby minimizing operational failures of the memory device due to the interference. In addition, this interference immunity may increase integration density of a non-volatile memory.

The foregoing is illustrative of example embodiments and is not to be construed as limiting thereof. Those skilled in the art will readily appreciate that many modifications and alternative forms are possible in the exemplary embodiments without materially departing from the novel teachings and advantages of the present inventive concept. Accordingly, all such modifications and alternative forms are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A non-volatile memory device comprising:
a substrate having an active region defined by a device isolation region, the device isolation region having a trench and an air gap, a sidewall of the trench being straight from a top to a bottom of the trench such that a width of the trench decreases with increasing depth;
a device isolation pattern positioned at a lower portion of the trench such that the air gap is positioned at an upper portion of the trench conformal to the straight sidewall of the trench;
a memory cell layer including insulation layers of a tunnel insulation layer, a trap insulation layer and a blocking insulation layer,
wherein the insulation layers are sequentially stacked on the active region,
wherein a top of the air gap is defined by at least one layer of the insulation layers and a bottom of the air gap is defined by a layer other than the at least one layer of the insulation layers,
wherein the at least one layer defining the top of the air gap extends from the active region toward the device isolation region; and
a control gate electrode positioned on the cell structure.

2. The non-volatile memory device of claim 1, wherein the tunnel insulation layer is conformally formed on the active region and the trench.

3. The non-volatile memory device of claim 2, wherein the trap insulation layer is positioned on the tunnel insulation layer formed on active region, wherein at least one layer of the insulation layers is formed of the trap insulation layer and the blocking insulation layer, and wherein the layer other than the at least one layer of the insulation layers is formed of the device isolation pattern.

4. The non-volatile memory device of claim 2, wherein the trap insulation layer is positioned on tunnel insulation layer formed on the active region, and wherein the at least one layer of the insulation layers is formed of the trap insulation layer, and wherein the layer other than the at least one layer of the insulation layers is formed of the tunnel insulation layer that is formed on the device isolation pattern.

5. The non-volatile memory device of claim 1, wherein the tunnel insulation layer is positioned on the active region, and wherein the at least one layer of the insulation layer is formed of the trap insulation layer, wherein the layer other than the at least one layer of the insulation layers is formed of the device isolation pattern, wherein the bottom of the air gap is defined by a top surface of the device isolation pattern.

6. The non-volatile memory device of claim 1, wherein the tunnel insulation layer is positioned on the active region, wherein the at least one layer of the insulation layers is formed of the trap insulation layer and the tunnel insulation layer, wherein the layer other than the at least one layer of the insulation layers is formed of the device isolation pattern, and wherein the bottom of the air gap is defined by a top surface of the device isolation pattern.

7. The non-volatile memory device of claim 1, wherein the at least one layer of the insulation layers includes a recess at a region corresponding to the center of the air gap.

8. The non-volatile memory device of claim 1, wherein a corner angle between an upper surface of the active region and a sidewall of the trench is over about 90°.

9. The non-volatile memory device of claim 1, wherein the trap insulation layer includes at least one of silicon nitride, silicon oxynitride, aluminum oxide, hafnium oxide and compositions thereof.

10. The non-volatile memory device of claim 1, wherein the tunnel insulation layer includes at least one of a silicon oxide layer and a silicon oxynitride layer.

11. A non-volatile memory device comprising:
a substrate;
a first active region in the substrate;
a second active region in the substrate;

a memory cell layer formed on the first and second active regions having a tunnel insulation layer, a trap insulation layer and a blocking insulation layer that are sequentially stacked on the first and second active regions; and a trench including a device isolation pattern at a lower portion of the trench, wherein the trench is positioned between the first and second active regions in the substrate and includes an air gap at an upper portion of the trench, wherein a top of the air gap is defined by at least one layer of the insulation layers and a bottom of the air gap is defined by a layer other than the at least one layer of the insulation layers, wherein the at least one layer defining the top of the air gap extends from the active region toward the device isolation region.

12. The non-volatile memory device of claim 11, wherein the at least one layer of the insulation layers is formed of the trap insulation layer and the blocking insulation layer, and the layer other than the at least one layer of the insulation layers is formed of the tunnel insulation layer, wherein the tunnel layer is disposed on sidewalls and a bottom of the trench.

13. The non-volatile memory device of claim 11, wherein the at least one layer of the insulation layers is formed of the trap insulation layer, and the layer other than the at least one layer of the insulation layers is formed of the tunnel insulation layer, wherein the tunnel layer is disposed on sidewall and a bottom of the trench.

14. The non-volatile memory device of claim 11, wherein the air gap has the top defined by the tunnel insulation layer, the bottom defined by a top surface of the tunnel insulation layer.

15. The non-volatile memory device of claim 11, the air gap has the top defined by the tunnel insulation layer and the trap insulation layer, and the bottom defined by a top surface of the tunnel insulation layer.

* * * * *